United States Patent
Le Lann et al.

(10) Patent No.: US 7,876,240 B2
(45) Date of Patent: Jan. 25, 2011

(54) ARITHMETIC DECODING METHOD AND DEVICE

(75) Inventors: Jean-Christophe Le Lann, Montreuil-Le-Gast (FR); Christophe Jollivet, Vern sur Seiche (FR); Gildas Cocherel, Sens de Bretagne (FR); Mickael Fossard, Rennes (FR)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/226,443

(22) PCT Filed: Apr. 5, 2007

(86) PCT No.: PCT/EP2007/053402
§ 371 (c)(1),
(2), (4) Date: Feb. 3, 2009

(87) PCT Pub. No.: WO2007/118811
PCT Pub. Date: Oct. 25, 2007

(65) Prior Publication Data
US 2009/0219177 A1    Sep. 3, 2009

(30) Foreign Application Priority Data
Apr. 18, 2006    (FR)    .................................. 06 03431

(51) Int. Cl.
*H03M 7/34*    (2006.01)
(52) U.S. Cl. ............................ 341/51; 341/50; 341/107
(58) Field of Classification Search .................. 341/50, 341/51, 107
See application file for complete search history.

(56) References Cited

U.S. PATENT DOCUMENTS
5,867,600 A * 2/1999 Hongu ........................ 382/247
(Continued)

FOREIGN PATENT DOCUMENTS
EP    1624580    2/2006

OTHER PUBLICATIONS

"Advanced video coding for generic audiovisual services" ITU-T Standard Pre-Published, Int'l Telecommunication Union, Geneva, CH, No. H264 3/5, Mar. 1, 2005, XP017401453.

Jian-Wen Chen et al: "A Hardware Accelerator for Context-Based Adaptive Binary Arithmetic Decoding in H.264/AVC" Circuits and Systems, 2005, IEEE Int'l Symposium on Kobe, Japan May 23-26, 2005, IEEE, pp. 4525-4528, XP010817170.

(Continued)

*Primary Examiner*—Jean B Jeanglaude
(74) *Attorney, Agent, or Firm*—Robert D. Shedd; Harvey D. Fried; James McKenzie

(57) ABSTRACT

A method for decoding elements is disclosed. The method decodes at least a part of the binary stream into a set of elements on the basis of first and second decoding parameters $CodIOffset_0$ and $CodIRange$, the set of elements comprising a prefix composed of n first elements and a suffix comprising m second elements, the prefix and the suffix being separated by an element called a pivot. The method comprises:
  determining the value of n on the basis of the first and second decoding parameters and of the values of k consecutive bits of the binary stream, termed k first bits, so as to deduce therefrom the prefix and the value of m; and
  determining the suffix on the basis of the first and second decoding parameters and of the values of m consecutive bits which follow the n first bits of the k first bits.

8 Claims, 9 Drawing Sheets

U.S. PATENT DOCUMENTS

| | | | |
|---|---|---|---|
| 6,489,903 B2* | 12/2002 | Kimura et al. | 341/107 |
| 6,894,628 B2* | 5/2005 | Marpe et al. | 341/107 |
| 2003/0108125 A1* | 6/2003 | Dombek | 375/324 |
| 2004/0240559 A1 | 12/2004 | Prakasam et al. | |
| 2006/0028359 A1* | 2/2006 | Kim et al. | 341/50 |

OTHER PUBLICATIONS

Search Report Dated Oct. 12, 2007.

* cited by examiner

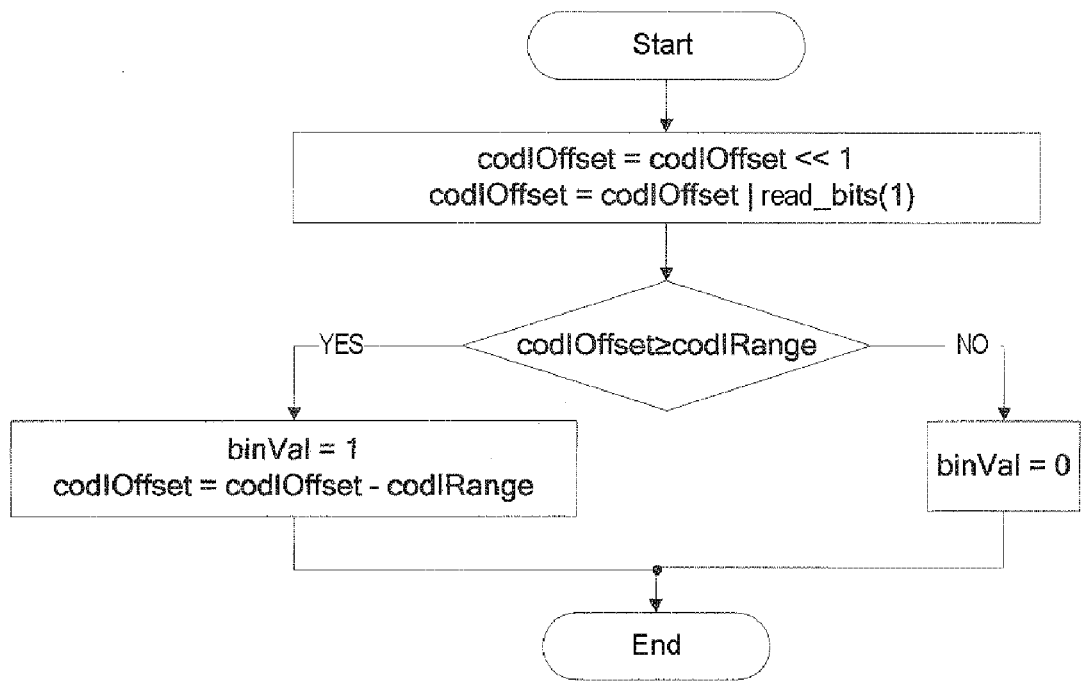
FIG.1 – Prior art
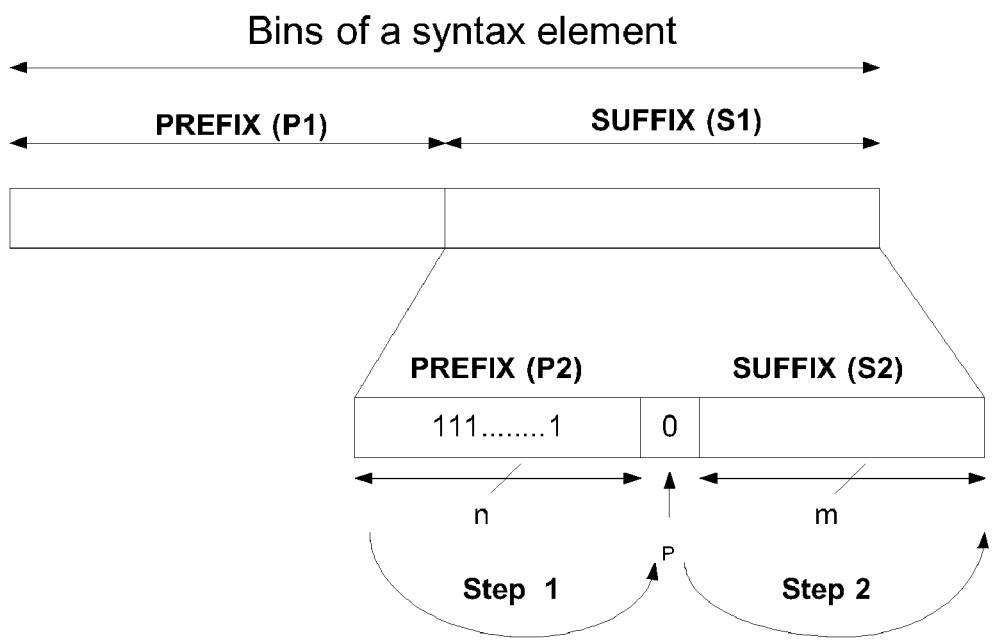
FIG. 2

ARITHMETIC DECODING METHOD AND DEVICE

1. FIELD OF THE INVENTION

This application claims the benefit, under 35 U.S.C. §365 of International Application PCT/EP2007/053402, filed Apr. 05, 2007, which was published in accordance with PCT Article 21(2) on Oct. 25, 2007 in English and which claims the benefit of French patent application No. 0603431, filed Apr. 18, 2006.

2. STATE OF THE ART

Digital data of audio or video type can be coded according to various coding methods. The field of arithmetic coding methods is known and the latter make it possible in particular to code a data item or a syntax element (e.g. a motion vector) with a non-integer number of bits. Thus, one and the same bit can contain the information relating to two different syntax elements contrary to what a Huffman coding allows. Such a bit is in this case called a fractional bit.

The H.264 video coding standard also known by the name MPEG-4 part 10 or MPEG-4 AVC proposes an entropy coding method which is a contextual arithmetic coding method known by the name CABAC ("Context-based Adaptive Binary Arithmetic Coding"). This coding method is adaptive insofar as the previously coded values influence the coding of the current syntax elements. In order to improve the times for decoding the syntax elements between the steps of entropy decoding and the subsequent processings (e.g. inverse quantization) and therefore reduce the necessary memory size, it is desirable to parallelize at least in part the contextual arithmetic decoding method, this being relatively complex because of the sequential nature of the said decoding method.

3. SUMMARY OF THE INVENTION

The invention is aimed at alleviating at least one of the drawbacks of the prior art. More particularly, the invention relates to a method for decoding elements coded according to an arithmetic coding method such as CABAC, the coded elements arising in the form of a binary stream. The method decodes at least a part of the binary stream into a set of elements on the basis of first and second predefined decoding parameters defining respectively the lower bound ($CodIOffset_0$) and the size (CodIRange) of an interval, the set of elements comprising a prefix (P2) composed of n first elements of predetermined identical value and a suffix (S2) comprising m second elements, m depending on n according to a predetermined function, the prefix (P2) and the suffix (S2) being separated by an element called a pivot (P). The method comprises the following steps:

determining by parallel computations the value of n on the basis of the first and second decoding parameters and of the values of k consecutive bits of the binary stream, termed k first bits, k being a predetermined integer greater than or equal to n, so as to deduce therefrom the prefix (P2) and the value of m; and determining by parallel computations the suffix (S2) on the basis of the first and second decoding parameters and of the values of m consecutive bits of the binary stream which follow the n first bits of the k first bits.

Preferably, the n first elements, the pivot (P) and the m second elements are bits.

According to a particular embodiment, the value of n is determined so that n is the smallest integer satisfying the following relation:

$$2^n\ CodIOffset_0 + val(n) - (2^n - 1)*CodIRange < CodIRange$$

Where:
val(n) is the value corresponding to the n first bits of the binary stream;
$CodIOffset_0$ is the value of the first parameter defining the lower bound of the interval; and
CodIRange is the value of the second parameter defining the size of the interval.

Furthermore, the suffix (S2) is determined so that its value is equal to the quotient $(2^n\ CodIOffset_0 + val(n))/CodIRange$.

The invention also relates to a device for decoding elements coded according to an arithmetic coding device such as CABAC, the coded elements arising in the form of a binary stream. The device decodes at least a part of the binary stream into a set of elements on the basis of first and second predefined decoding parameters defining respectively the lower bound ($CodIOffset_0$) and the size (CodIRange) of an interval, the set of elements comprising a prefix (P2) composed of n first elements of predetermined identical value and a suffix (S2) comprising m second elements, m depending on n according to a predetermined function, the prefix (P2) and the suffix (S2) being separated by an element called a pivot (P). The device comprises:

means) operating in parallel for determining the value of n on the basis of the first and second decoding parameters and of the values of k consecutive bits of the binary stream, termed k first bits, k being a predetermined integer greater than or equal to n, so as to deduce therefrom the prefix (P2) and the value of m; and means) operating in parallel for determining the suffix (S2) on the basis of the first and second decoding parameters and of the values of at most m consecutive bits of the binary stream which follow the n first bits of the k first bits.

Preferably, the means for determining the suffix (S2) comprise an on-silicon divider.

Advantageously, the decoding device furthermore comprises means for concatenating the prefix P2, the pivot P and the suffix S2.

Preferably, characterized in that the decoding device furthermore comprises means for shifting the binary stream by an integer number of bits equal to m+n+1.

The invention also relates to a computer program product which comprises program code instructions for the execution of the steps of the method according to the invention, when the program is executed on a computer.

4. LISTS OF FIGURES

The invention will be better understood and illustrated by means of wholly non-limiting advantageous exemplary embodiments and modes of implementation, with reference to the appended figures in which:

FIG. 1 illustrates a method of decoding, according to the state of the art, bits called "bins" representing syntax elements or a part of such elements coded in a particular mode called bypass mode in accordance with the H.264 standard;

FIG. 2 represents the bins of a particular syntax element exhibiting a certain regularity;

5. DETAILED DESCRIPTION OF THE INVENTION

Figure 3:
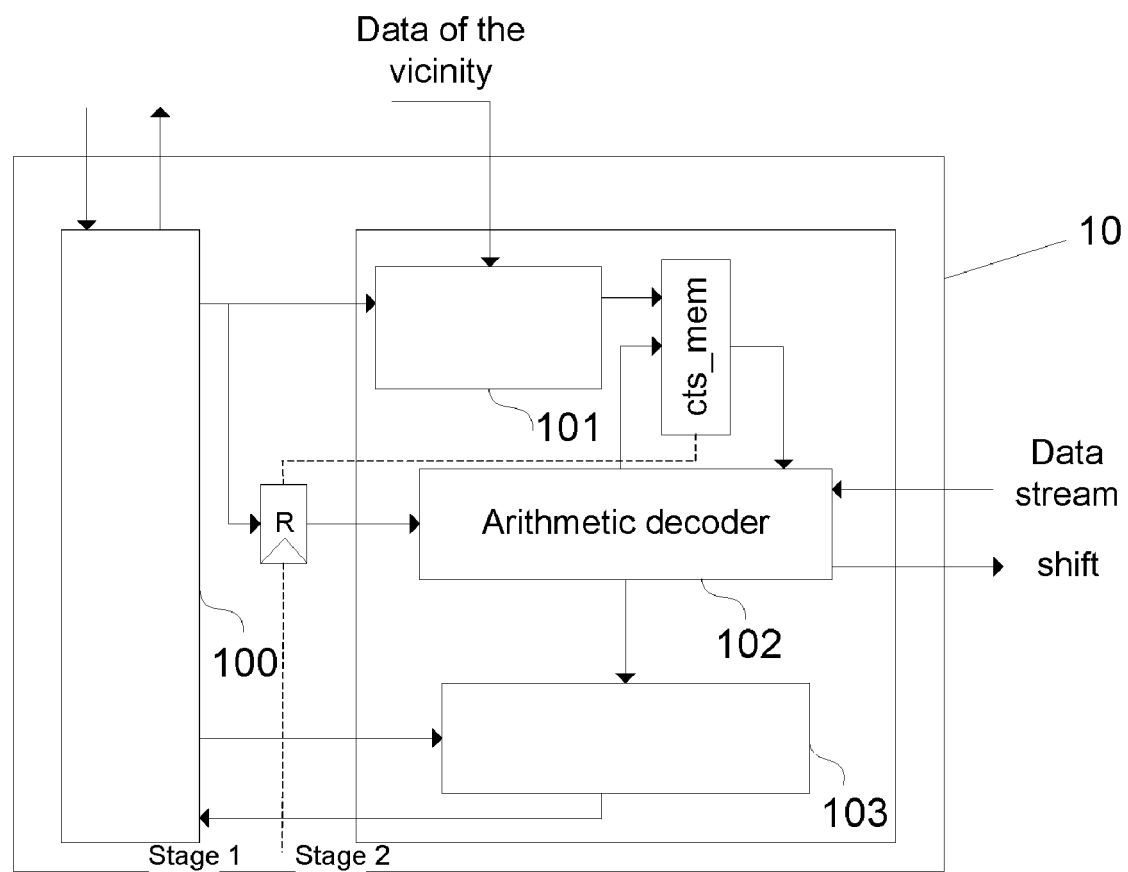
FIG. 3 represents a contextual arithmetic decoding device according to the invention in the form of modules.

The invention is described within the framework of an application of decoding of a sequence of images in accordance with the H.264 standard when the CABAC contextual arithmetic coding mode is activated. During the coding of a sequence of images, certain syntax elements, e.g. the motion vectors, appear frequently. It is therefore important to be able to decode them in an effective manner. For this purpose, the objective of the invention is to parallelize at least partially the method for decoding digital data coded previously by a contextual arithmetic coding method such as CABAC.

In accordance with the H.264 standard, the syntax elements are not coded directly by an arithmetic coding method. Specifically, a syntax element is, during a first coding step called the binarization step, coded by using a variable-length code consisting of bits called "bins" to distinguish them from the bits of the final data stream with the aid of tables and/or methods defined in the document entitled "Draft of version 4 of H.264/AVC (ITU-T Recommendation H.264 and ISO/IEC 14496-10 (MPEG-4 part 10) Advanced Video Coding)" of the ISO/IEC MPEG and ITU-T VCEG referenced JVT-M050d4. The thus generated set of bins is coded, during a second step, by a contextual arithmetic coding method into a set of bits which is the coded data stream ("bitstream"). Thereupon, in contradistinction to a conventional entropy decoding method (e.g. such as that used within the framework of the MPEG-2 standard), an entropy decoding method such as that used within the framework of the H.264 standard comprises the following steps:

reading a certain number of bits in the coded data stream;

generating during a step of contextual arithmetic decoding, on the basis of these bits, a second stream of successive bits or bins representing a syntax element (like for example a DCT coefficient or a vector component) in a sequential manner; and generating the syntax element on the basis of the bins generated during the preceding step.

The last step of the decoding method is called the debinarization step. A given number of bits can be transformed into a number of different bins. These bins are stored and interpreted so as to retrieve the value of the complete syntax element. It should be noted that when a syntax element value has been decoded, it is possible to continue to extract information for the following syntax element on the basis of the same last bit. In the case of the H.264 standard, the coding method can consider a degraded arithmetic coding mode (called the "bypass" mode) following the type of syntax element that it seeks to code. The coding method then sets the value of a particular parameter called bypassFlag to 1. The value of this parameter is determined by the decoding method according to the invention as a function of the type of syntax element that the latter has to decode. Specifically, the H.264 standard specifies whether a given syntax element has to be coded in the degraded mode or the non-degraded mode. The degraded mode is in particular used to code syntax elements or parts of such elements whose distribution is approximately uniform. FIG. 2 represents the bins of a syntax element (for example the motion vectors mvd_l0 and mvd_l1 and the coefficients coef_abs_level_minus1 defined in the H.264 standard) of which at least a part is coded according to the degraded mode. For example, the suffixes S1 of the motion vector syntax elements and of the coefficients coef_abs_level_minus1 are, according to the H.264 standard, coded in this degraded mode. For the motion vectors, the bins of the suffix S1 follow the first 9 bins of a prefix P1. For the coefficients coef_abs_level_minus1 the bins of the suffix S1 follow the first 14 bins of a prefix P1. If the value of such syntax elements is less than certain values (depending on the number of bins in the prefix P1) there may be no suffix S1. The prefixes P1 coded in the non-degraded mode, i.e. bypassFlag=0, are decoded according to a conventional contextual arithmetic decoding method such as described in the document JVT-M050d4. The suffixes S1 are decoded according to the method of the invention.

FIG. 1 represents the decoding method according to the state of the art and described in the document JVT-M050d4. This method makes it possible to generate the succession of bins representing a syntax element or a part of such an element coded in the degraded mode. The operators used are defined in the document JVT-M050d4: the operator '<<' is the "left shift" operator, the operator '|' is the "OR" operator and the operator '&' is the "AND" operator. The function val (m) returns the value obtained by "reading m bits" in the coded data stream. This function. The decoding parameters $CodIOffset_0$ and CodIRange which characterize the current state of the arithmetic decoder respectively define the lower bound a nd the size of an interval. These decoding parameters are initialized in the images at the start of each slice: $CodIOffset_0=0$ and CodIRange=1. binVal designates the value of the current bin. By running the method illustrated by FIG. 1, i.e. by applying it several times in succession, we hit a priori the combinatorial of all the possibilities of branching encountered at each iteration (YES and NO branch). However, it is possible to simplify this method by parallelizing it in the case of the decoding of the suffixes S1 of the syntax elements considered, i.e. motion vectors and coefficients. Specifically, the series of bins representing these suffixes S1 are not random. They exhibit regularities and in particular they comprise:

a prefix P2 consisting of a series of n bins of value '1';

a bin '0' called a pivot and referenced P; and a suffix S2 consisting of a random series of m bins, where m depends on n according to a predetermined function for example $m=n+n_0$, $n_0$ being an integer whose value is known and depends on the current syntax element.

By running the method according to the state of the art k times, the following k relations are obtained:

relation of order 1:

$$codIOffset_1=(2 \times codIOffset_0+val(1))-codIRange$$

relation of order 2:

$$codIOffset_2 = (2 \times codIOffset_1 + val(1)) - codIRange$$
$$= (2^2 \times codIOffset_0 + val(2)) - (2^2 - 1) \times codIRange$$

relation of order 3:

$$codIOffset_3=(2^3 \times codIOffset_0+val(3))-(2^3-1) \times codIRange$$

relation of order k:

$$codIOffset_k = (2^k \times codIOffset_0 + val(k)) - (2^k - 1) \times codIRange$$

Thus, it is possible during a step 1 on the basis solely of the values of $CodIOffset_0$ and CodIRange to determine the position of the pivot P, i.e. the value of n and consequently the length m of the suffix S2. Specifically, the smallest index p such that the relation $CodIOffset_p < CodIRange$ is precisely satisfied determines the position of the pivot. If it is assumed that the index of the first bin of P2 is zero then p=n. Knowing that p is always less than k (e.g. k=14), it suffices henceforth, in order to determine this value, to calculate in parallel k values of $CodIOffset_k$ and to compare all these values with CodIRange. On completion of this step, the value of $CodIOffset_0$ is updated: $codIOffset_0 = codIOffset_p$. Subsequently, we consider the data stream after the $p^{th}$ bit to determine values val(1) . . . val(m).

After having determined the position p of the pivot P, the number m of bins that remain to be generated during a step 2 so as to reconstruct the suffix S2 of the suffix S1 is known: $m = n + n_0$. However, the value of each of these bins remains to be determined during this second step. By again running the method according to the state of the art m times, the following m relations are obtained:

$$codIOffset_1 = 2^1 \times codIOffset_0 + val(1) - b_0 \times codIRange$$

$$codIOffset_2 = 2^2 \times codIOffset_0 + val(2) - (2 \times b_0 + b_1) \times codIRange$$

$$codIOffset_3 = 2^3 \times codIOffset_0 + val(3) - (2^2 \times b_0 + 2 \times b_1 + b_2) \times codIRange$$

$$codIOffset_m = 2^m codIOffset_0 + val(m) - codIRange \times [2^{m-1} b_0 + 2^{m-2} b_1 + \ldots + b_{m-1}]$$

Let us put $\alpha = 2^m codOffset_0 + val(m)$ and $B = [2^{m-1} b_0 + 2^{m-2} b_1 + \ldots + b_{m-1}]$. $\alpha$ is a constant which depends on the values of m bits of the data stream, m being known, and the value of $CodIOffset_0$, also known. The standard furthermore imposes that the value $CodIoffset_m$ be less than codIRange. Thereupon, B is equal to the quotient $\alpha/codIRange$ and $CodIOffset_m$ to the remainder of this same division since $\alpha = CodIRange \ast B + codIOffset_m$ and $CodIOffset_m < codIRange$. The value codIRange is thus subtracted a maximum of times from the value $\alpha$ in accordance with the H.264 standard.

Having determined the position of the pivot during step 1 and therefore the prefix P2, then having determined the value of the bins of the suffix S2, i.e. the value B during step 2, the suffix S1 is entirely determined by concatenation of P2, S2 and of the pivot. On completion of steps 1 and 2, the value of CodIRange is not modified and the value of $CodIOffset_0$ is updated with the value of $CodIOffset_m$. These, possibly updated, values of CodIRange and $CodIOffset_0$ are those which will be used when the contextual arithmetic coding method will again be used to decode bins whether in degraded or non-degraded mode.

The invention also relates to a contextual arithmetic decoding device 10 which implements the arithmetic decoding method according to the invention. In the figures which follow, the modules represented are functional units, which may or may not correspond to physically distinguishable units. For example, these modules or some of them can be grouped together as a single component, or constitute functionalities of one and the same piece of software. Conversely, certain modules may possibly be composed of separate physical entities. With reference to FIG. 3, the decoding device 10 comprises in particular a monitoring module 100 whose role is to monitor the complete data path. The monitoring module 100 takes for example the form of a state machine (FSM— "Finite State Machine"). The decoding device 10 furthermore comprises a module 101 making it possible to select on the basis of the neighbouring data a context stored in a memory referenced cts_mem in FIG. 3. The decoding device 10 moreover comprises an arithmetic decoding module 102 which implements the previously described decoding method according to the invention. In order to synchronize the two stages of the pipeline processing, the decoding device 10 comprises a register R located between the monitoring module 100 and the arithmetic decoding module 102. The arithmetic decoding module 102 will possibly read a context value in the memory cts_mem and generates a bin on the basis of the data stream received as input. It will also update the context in the memory cts_mem. This bin is transmitted to a debinarization module 103. It also dispatches a shift command to an external shifter which shifts the data stream by a certain number of bits. The debinarization module 103 makes it possible to generate the syntax elements on the basis of the bins generated by the arithmetic decoder 102.

Figure 4:
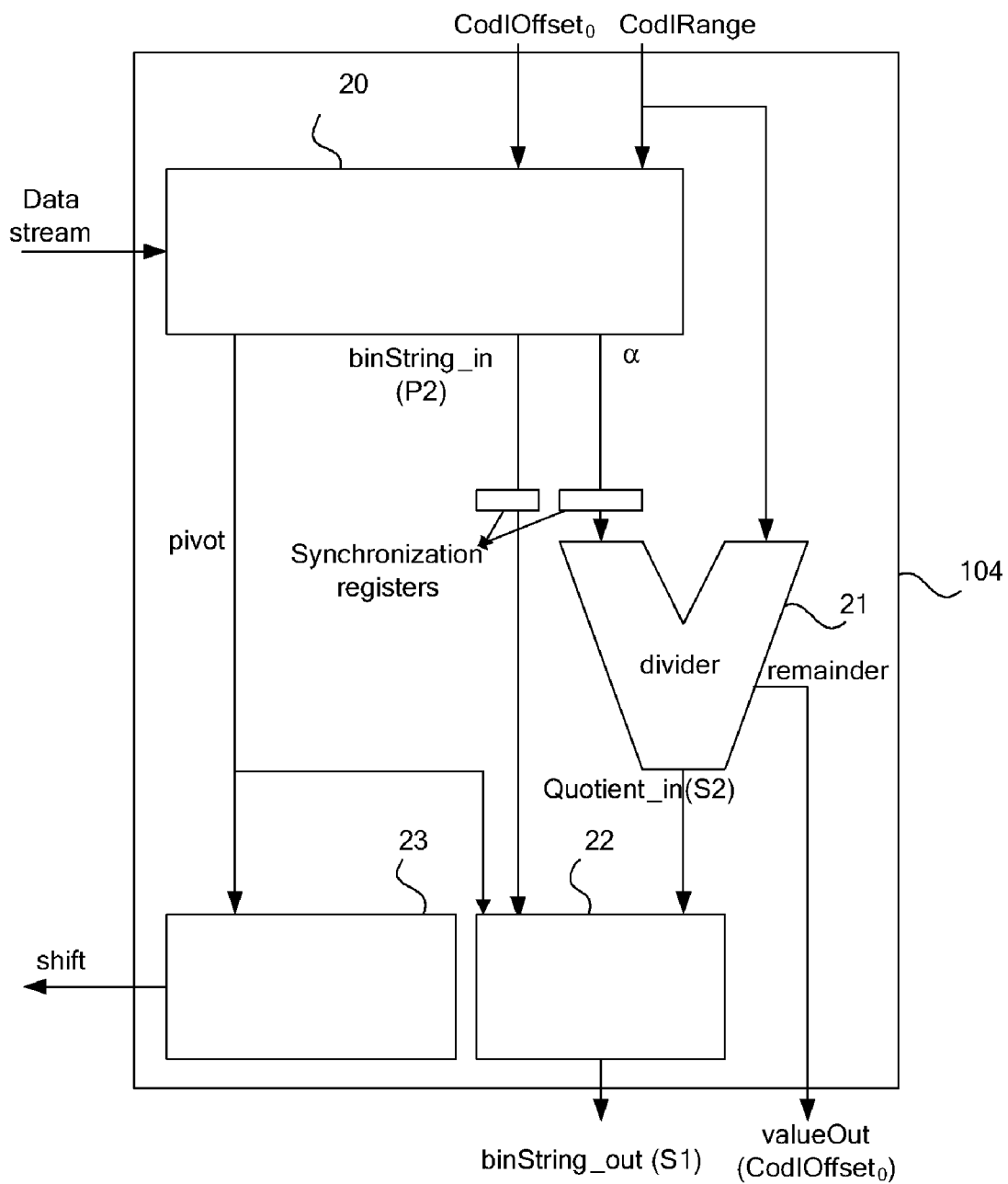
FIG. 4 represents a part of a module of the contextual arithmetic decoding device represented by FIG. 3.
Figure 9:
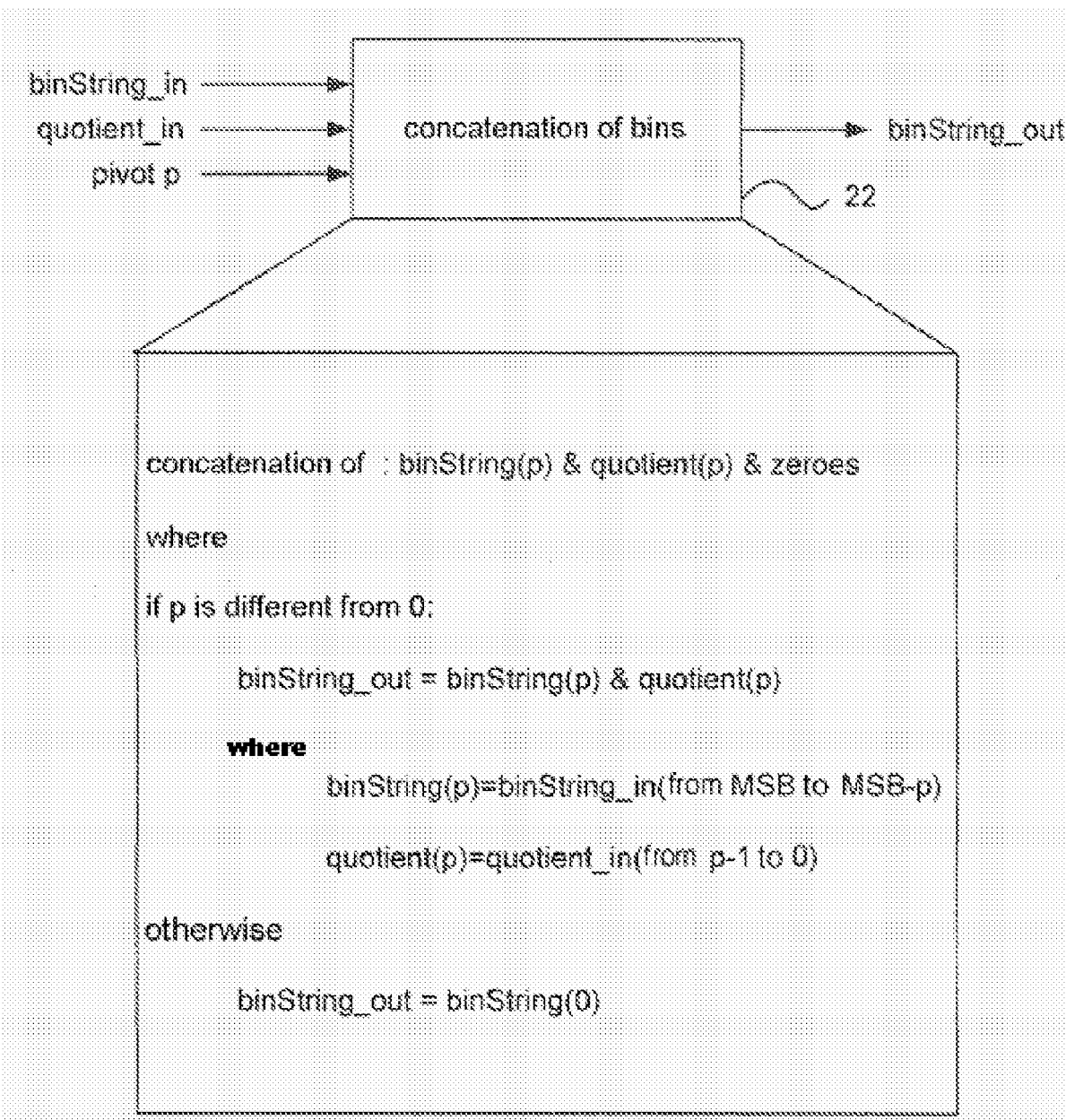
FIG. 9 represents a second calculation module of the part of the decoding device represented by FIG. 4.
Figure 10:
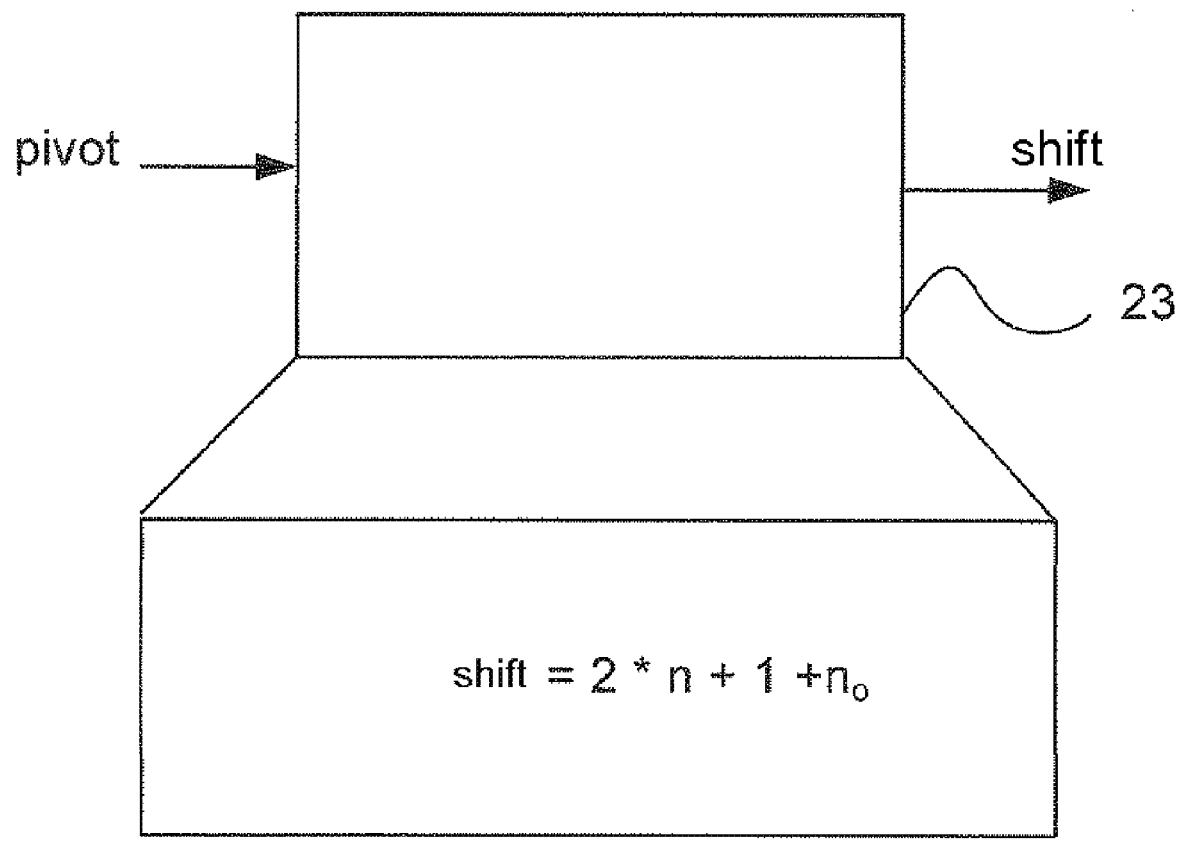
FIG. 10 represents a third calculation module of the part of the decoding device represented by FIG. 4.

The arithmetic decoding module 102 comprises a first module which implements the conventional arithmetic decoding method proposed by the standard for decoding the bins of syntax elements or of parts of such elements other than those for which the decoding method according to the invention is used (i.e. suffixes of the motion vectors and coefficients coef_abs_level_minus1). The arithmetic decoding module 102 also comprises a second module 104 represented in FIG. 4 which implements the method according to the invention. The module 104 comprises in particular a first calculation module 20 making it possible to calculate the position of the pivot P according to step 1 of the method according to the invention, to generate the prefix P2 of the suffix S1 and to calculate the value of $\alpha$. It furthermore comprises a calculation module 21 making it possible to do the division of a by the parameter CodIRange so as to calculate the value of the suffix S2 and the new value of $CodIOffset_0$. This calculation module 21 is for example an on-silicon divider. The module 104 also comprises a concatenation module 22 represented in FIG. 9 making it possible to generate the suffix S1 by concatenating the prefix P2 generated by the calculation module 20, the pivot P and the suffix S2 generated by the calculation module 21. The module 104 comprises a module 23 represented in FIG. 10 making it possible to calculate an integer number of bits (m+n+1), the said number being transmitted to a shifter charged with shifting the data stream by this number of bits.

Figure 5:
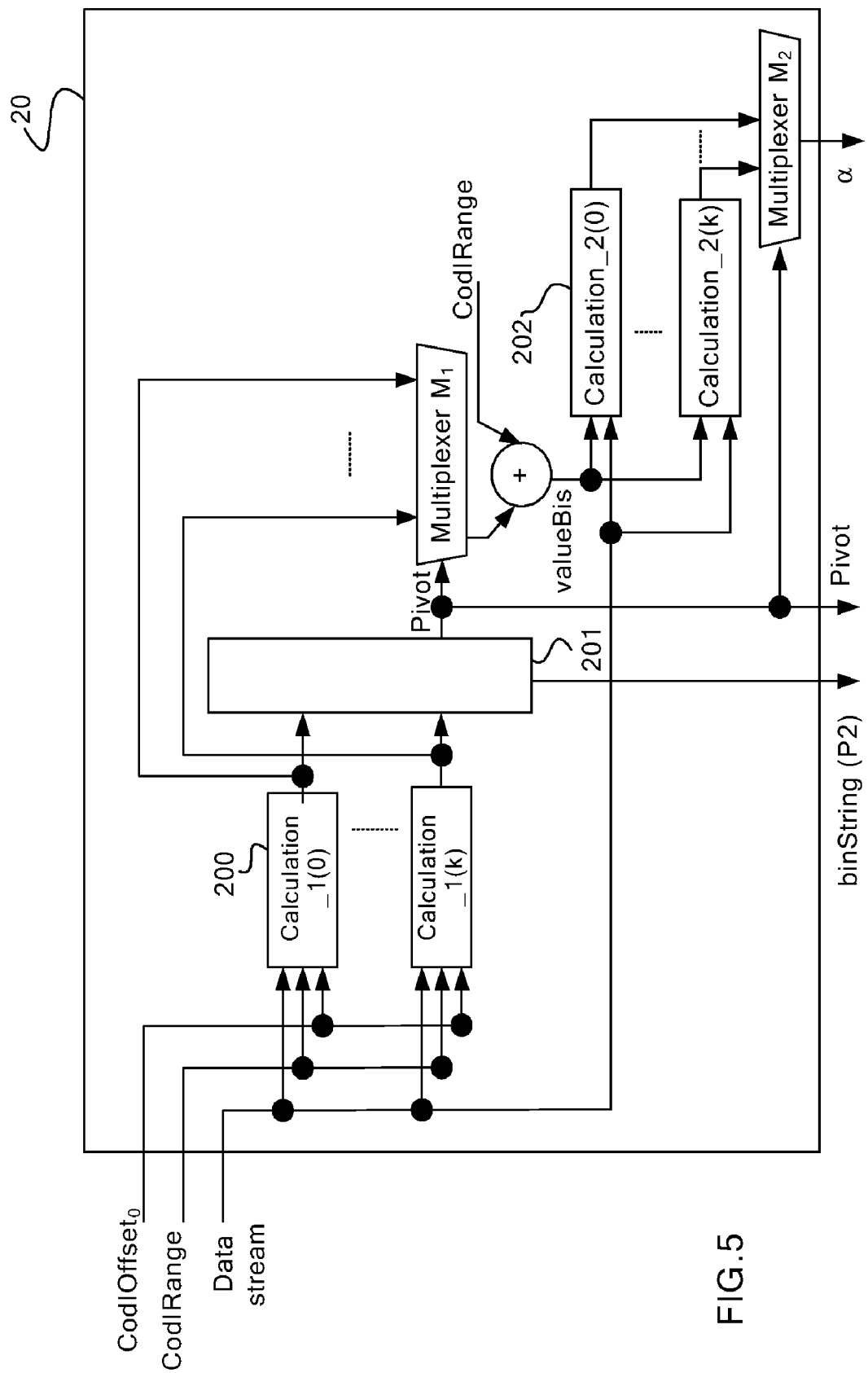
FIG. 5 represents a first calculation module of the part of the decoding device represented by FIG. 4.
Figure 6:
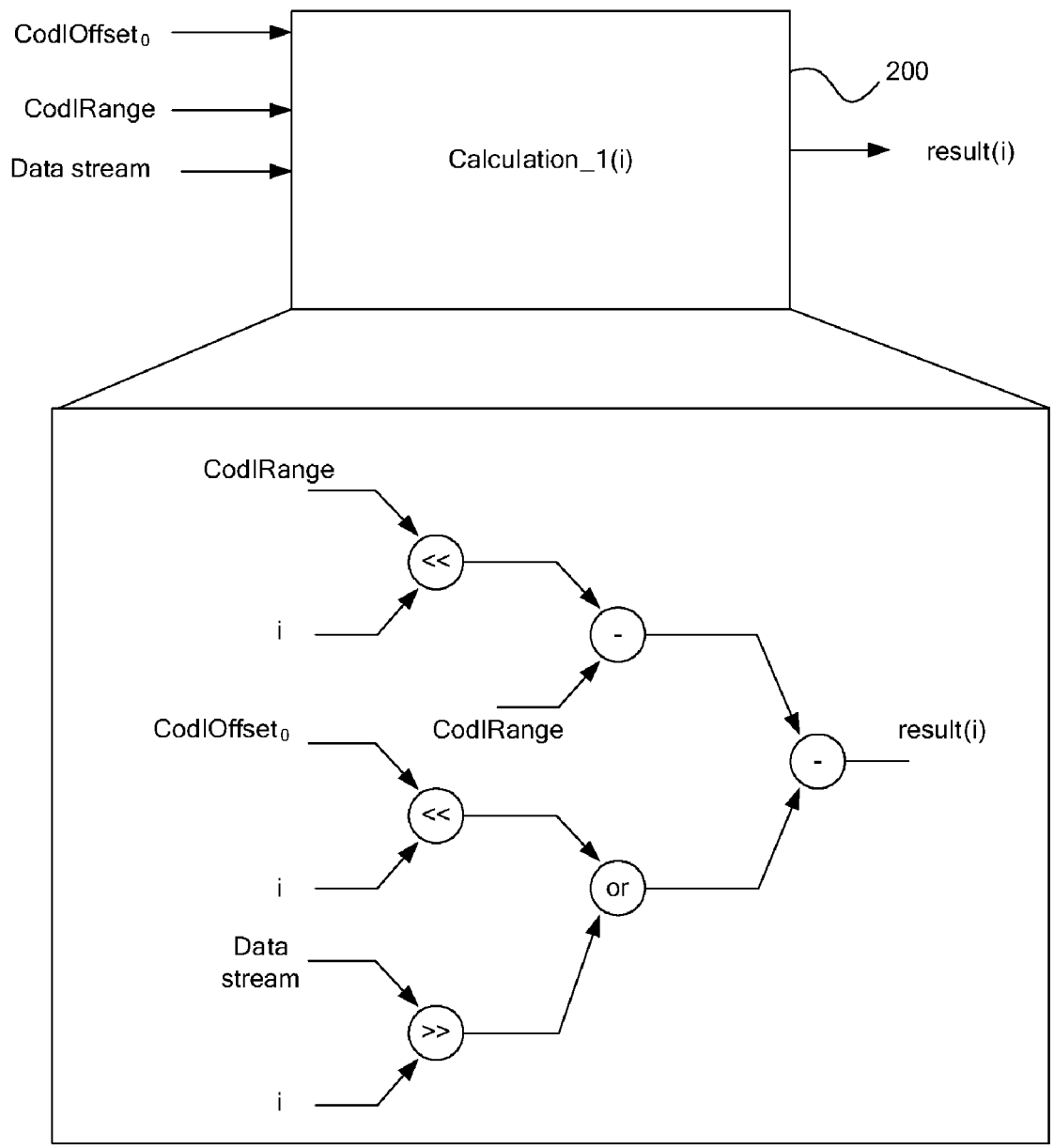
FIG. 6 represents a first calculation block of the module illustrated by FIG. 5.

The calculation module 20 represented in FIG. 5 comprises first calculation modules 200 represented in FIG. 6 making it possible to calculate in parallel the following k relations:

$$\text{Calculation}\_1(k) = (2^k \times codIOffset_0 + var(k)) - 2^k \times codIRange)$$

Figure 7:
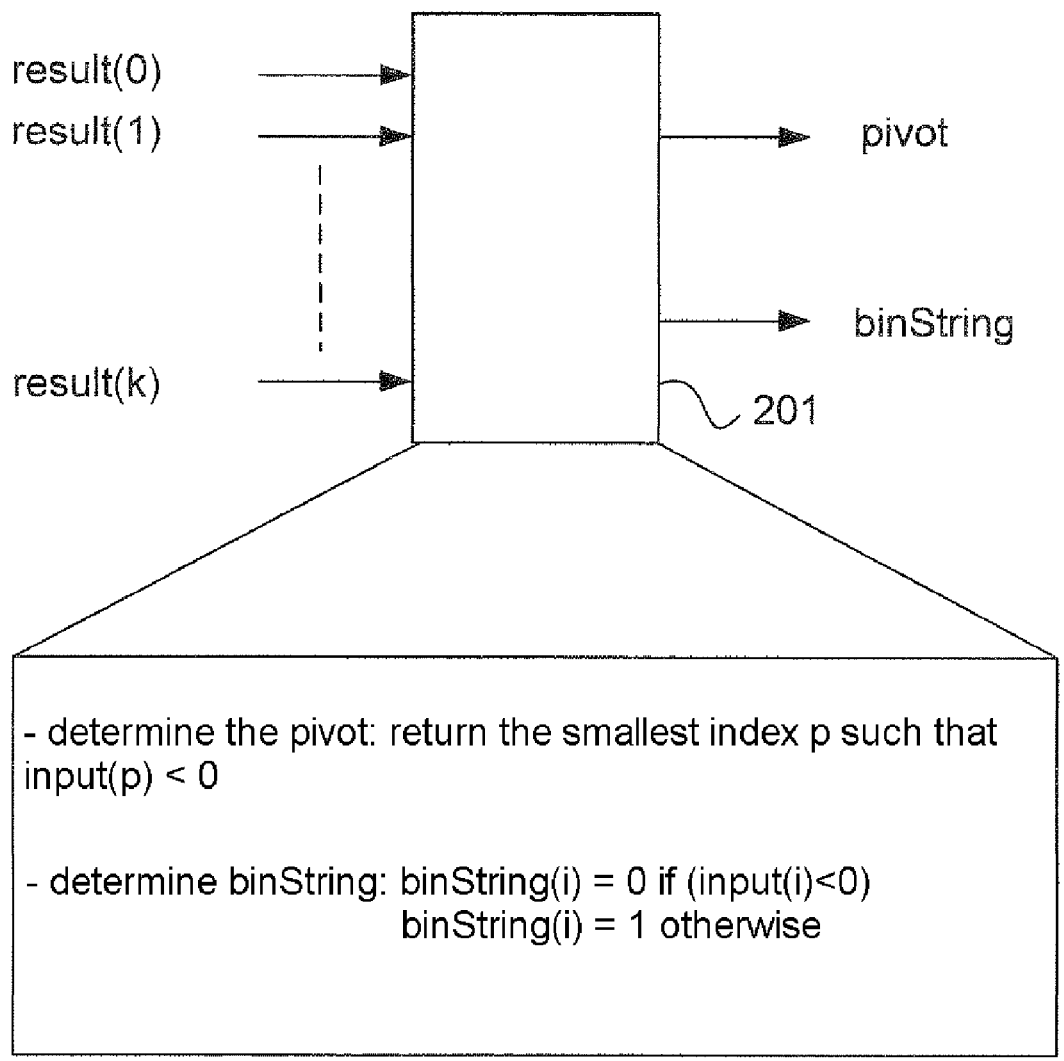
FIG. 7 represents a second calculation block of the module illustrated by FIG. 5.
Figure 8:
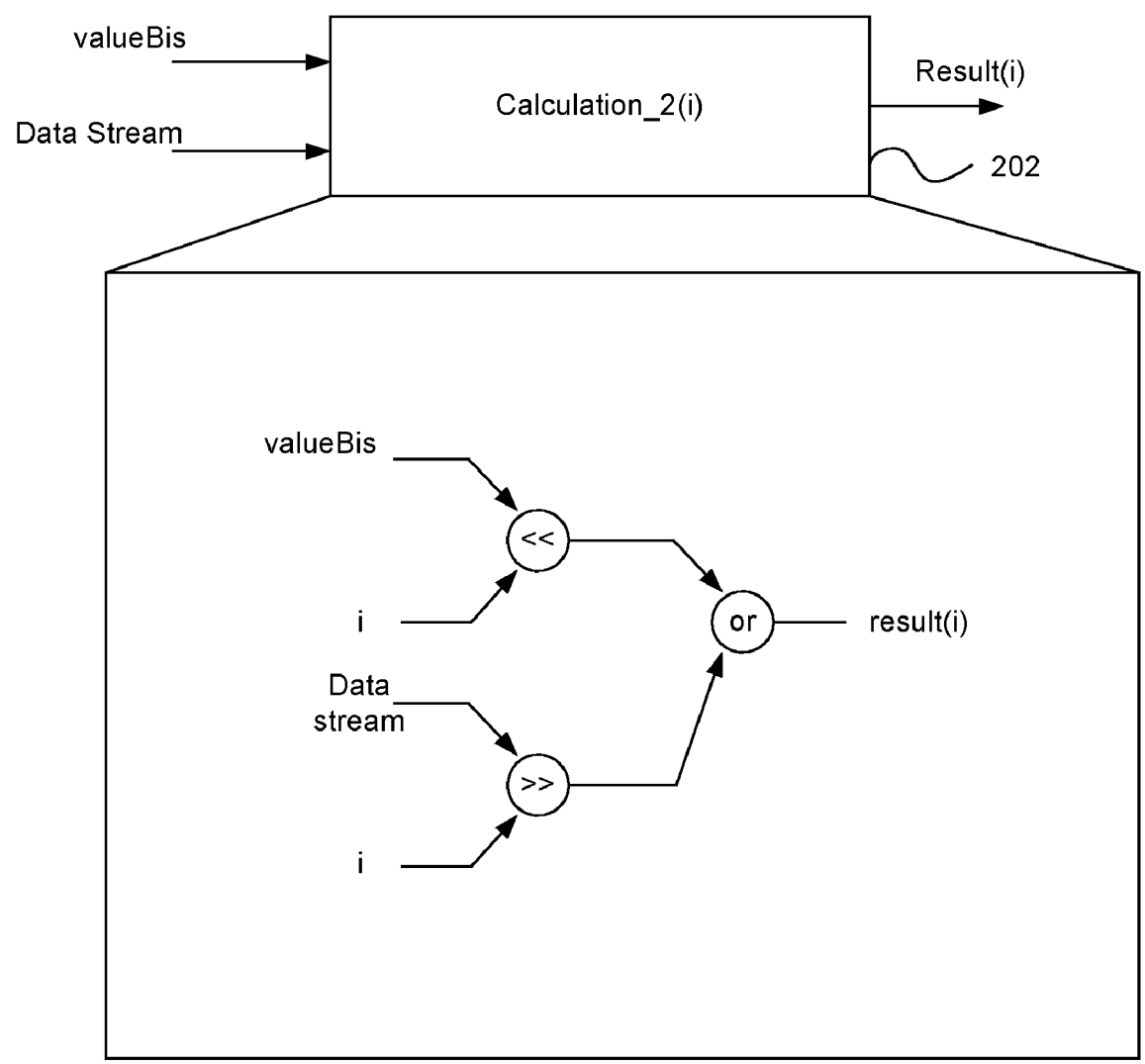
FIG. 8 represents a third calculation block of the module illustrated by FIG. 5.

It also comprises a module 201 represented in FIG. 7 making it possible to determine the position p of the pivot P by comparing with the zero value the k values Calculation_1(k) calculated by the first calculation modules 200 thereby amounting to comparing the k values of $CodIOffset_k$ with the value CodIRange. It also comprises a first multiplexer $M_1$ making it possible to select the value Calculation_1(p) from among the k calculated values. The calculation module 20 furthermore comprises second calculation modules 202 rep resented in FIG. 8 making it possible to calculate the following k relations:

$$\text{Calculation\_2}(k) = 2^k \, codOffset_0 + var(k)$$

It furthermore comprises a multiplexer $M_2$ making it possible to select the value Calculation_2(m) from among the k calculated values, the value of m being known following the determination of the position of the pivot. The value of the parameter α which is equal to Calculation_2(m) is used by the calculation module 21 to calculate the value of the suffix S2 and the new value of the offset $CodIOffset_0$.

Of course, the invention is not limited to the exemplary embodiments mentioned above. In particular, the person skilled in the art can introduce any variant to the embodiments set forth and combine them to benefit from their various advantages. The invention described within the framework of video data is not limited to this type of data and can in particular apply to data of audio, voice type. Neither is it limited to the H.264 standard and can in particular be applied to other standards implementing a contextual arithmetic coding method in accordance with H.264.

The invention claimed is:

1. Method for decoding elements coded according to an arithmetic coding method such as CABAC, the said coded elements arising in the form of a binary stream, the said method decoding at least a part of the said binary stream into a set of elements on the basis of a first predefined decoding parameter $CodIOffset_0$ defining the lower bound of an interval and on the basis of a second predefined decoding parameter CodIRange defining the size of said interval, the said set of elements comprising a prefix composed of n first elements of predetermined identical value and a suffix comprising m second elements, m depending on n according to a predetermined function, the said prefix and the said suffix being separated by an element called a pivot, the said method comprises the following steps:

determining by k parallel computations the value of n on the basis of the said first and second decoding parameters and of the values of k consecutive bits of the said binary stream, termed k first bits, k being a predetermined integer greater than or equal to n, so as to deduce therefrom the said prefix and the value of m;

computing the following k values in parallel: $2^k * CodIOffset_0 + val(k)$ where val(k) is the value corresponding to the k first bits of the said binary stream;

selecting among the k value, the value for which k equal m; and determining the suffix as the quotient of the selected value divided by CodIRange.

2. Method according to claim 1, wherein the said n first elements, the pivot and the said m second elements are bits.

3. Method according to claim 2, wherein the value of n is determined so that n is the smallest integer satisfying the following relation:

$$2^n CodIOffset_0 + val(n) - (2^n - 1) * CodIRange < CodIRange$$

Where:
val(n) is the value corresponding to the n first bits of the said binary stream;
$CodIOffset_0$ is the value of the said first parameter defining the lower bound of the said interval; and
CodIRange is the value of the said second parameter defining the size of the said interval.

4. Computer program product comprising program code instructions for the execution of the steps of the method according to claim 1, when the said program is executed on a computer.

5. Device for decoding elements coded by an arithmetic coding device such as CABAC, the said coded elements arising in the form of a binary stream, the said device decoding at least a part of the said binary stream into a set of elements on the basis of a first predefined decoding parameter $CodIOffset_0$ defining the lower bound of an interval and on the basis of a second predefined decoding parameter CodIRange defining the size of said interval, the said set of elements comprising a prefix composed of n first elements of predetermined identical value and a suffix comprising m second elements, m depending on n according to a predetermined function, the said prefix and the said suffix being separated by an element called a pivot, the said device comprises:

means operating in parallel for determining the value of n on the basis of the said first and second decoding parameters and of the values of k consecutive bits of the said binary stream, termed k first bits, k being a predetermined integer greater than or equal to n, so as to deduce therefrom the said prefix and the value of m;

means for computing the following k values in parallel: $2^k * CodIOffset_0 + val(k)$ where val(k) is the value corresponding to the k first bits of the said binary stream:

means for selecting, among the k values, the value for whick k equal m; and means for determining the suffix by dividing the selected value by CodIRange.

6. Device according to claim 5, wherein the said means for determining the suffix comprise an on-silicon divider.

7. Device according to claim 6, wherein the said decoding device furthermore comprises means for concatenating the said prefix, the said pivot and the said suffix.

8. Device according to claim 7, wherein the said decoding device furthermore comprises means for shifting the binary stream by an integer number of bits equal to m+n+1.

* * * * *